United States Patent
Louwsma et al.

(10) Patent No.: US 8,089,302 B2
(45) Date of Patent: Jan. 3, 2012

(54) TIME INTERLEAVED TRACK AND HOLD

(75) Inventors: Simon Minze Louwsma, Enschede (NL); Maarten Vertregt, Eindhoven (NL)

(73) Assignee: NXP B.V., Eindhoven (NL)

( * ) Notice: Subject to any disclaimer, the term of this patent is extended or adjusted under 35 U.S.C. 154(b) by 76 days.

(21) Appl. No.: 12/676,914

(22) PCT Filed: Sep. 9, 2008

(86) PCT No.: PCT/IB2008/053628
§ 371 (c)(1),
(2), (4) Date: Mar. 8, 2010

(87) PCT Pub. No.: WO2009/034518
PCT Pub. Date: Mar. 19, 2009

(65) Prior Publication Data
US 2010/0176868 A1    Jul. 15, 2010

(30) Foreign Application Priority Data

Sep. 12, 2007  (EP) ..................................... 07116198
Sep. 9, 2008   (WO) ................... PCT/IB2008/053628

(51) Int. Cl.
*G11C 27/02*     (2006.01)
*H03K 5/00*      (2006.01)
*H03K 17/00*     (2006.01)

(52) U.S. Cl. .......................................... 327/94; 327/91

(58) Field of Classification Search ................. 327/91, 327/94
See application file for complete search history.

(56) References Cited

U.S. PATENT DOCUMENTS

| | | | |
|---|---|---|---|
| 6,198,314 B1 | 3/2001 | Kase | |
| 7,015,842 B1 | 3/2006 | Gupta et al. | |
| 7,233,173 B1 | 6/2007 | Lewicki et al. | |
| 2002/0070886 A1* | 6/2002 | Nagaraj et al. ................ | 341/122 |

(Continued)

FOREIGN PATENT DOCUMENTS

GB    1 079 027    8/1967

OTHER PUBLICATIONS

Louwsma, Simon. M., et al, "A 1.6GS/s, 16 Times Interleaved Track & Hold With 7.6 ENOB in 0.12um CMOS", Proc. ESSCIRC, pp. 343-346 (Sep. 2004).

(Continued)

*Primary Examiner* — Lincoln Donovan
*Assistant Examiner* — John Poos

(57) ABSTRACT

The present application relates to an apparatus comprising a first transistor element, with at least three terminals, and at least one switching unit. The present application relates also to a method, computer readable medium having a computer program stored thereon and a track and hold circuit comprising the apparatus. The apparatus comprises a first transistor element with at least three terminals, wherein a first terminal is supplied with a first voltage, and wherein a second terminal is supplied with a second voltage. The apparatus comprises a first switching unit, wherein a third terminal is connected to ground potential via the first switching unit. The transistor element comprises a predefined threshold voltage. The first voltage and the second voltage are predefined alternating voltages. The transistor element is configured such that in case a differential voltage between the first predefined alternating voltage and the second predefined alternating voltage is higher than the predefined threshold voltage and the first switching unit is not conductive the third terminal is charged with the first predefined alternating voltage.

20 Claims, 5 Drawing Sheets

U.S. PATENT DOCUMENTS

2004/0084696 A1* 5/2004 Chiu .............................. 257/200
2009/0206885 A1* 8/2009 Sundblad et al. ............... 327/91

OTHER PUBLICATIONS

Gupta, Sandeep, et al; "A 1GS/s 11b Time-Interleaved ADC in 0.13 um CMOS", 2006 IEEE International Solid-State Circuits Conference, Session 31, Paper 31.6, pp. 264-265 (10 PGS. as reproduced) (Feb. 2006).

Nagaraj, Krishnaswamy, et al, "A Dual-Mode 700-Msample/S 6-Bit 200-Msamples/S 7-Bit A/D Converter in a 0.25 UM Digital CMOS Process", IEEE J. of Solid-State Circuits; vol. 35, No. 12, pp. 1760-1768 (Dec. 2000).

Poulton, K., et al, "A 20GS/s 8b ADC With a 1 MB Memory in 0.18um CMOS", 2003 IEEE Int'l Solid-State Circuits Conf., Session 18, Paper 18.1, pp. 318-319 (10 pgs. as reproduced) (Feb. 2003).

Louwsma, Simon M., et al, "A Time-Interleaved Track & Hold in 0.13um CMOS Sub-Sampling a 4 GHz Signal With 43dB SNDR", Custom Integrated Circuits Conference, IEEE, 4 Pages (Sep. 2007).

International Search Report for International Patent Application PCT/IB2008/053628 (Mar. 5, 2009), Published as WO 2009/034518 A3.

* cited by examiner

TIME INTERLEAVED TRACK AND HOLD

TECHNICAL FIELD

The present application relates to an apparatus comprising a first transistor element, with at least three terminals, and at least one switching unit. The present application relates also to a method, computer readable medium having a computer program stored thereon and a track and hold circuit comprising the apparatus.

BACKGROUND

To sample broadband signals of e.g. satellite receivers, track and hold (T/H) circuits are needed with a bandwidth of about 1 GHz and linearity above 50 dB or the like. For software defined radios an even larger bandwidth is desired. To be able to embed the T/H circuit together with an analogue digital converter (ADC) in a digital integrated circuit (IC), the power consumption of the T/H circuit and the ADC should be limited to a few hundred milliwatts. Time-interleaving is a good way of combining power efficiency with high speed. However, a time-interleaved T/H circuit needs a signal bandwidth per channel far beyond the sample-rate of an individual channel. Moreover, it requires matching between its channels. The T/H circuit may be a successor as described in document "A 1.6 GS/s,16 times interleaved track & hold with 7.6 ENOB in 0.12 μm CMOS," S. M. Louwsma, E. J. M. van Tuijl, M. Vertregt, P. C. S. Scholtens and B. Nauta, Proc. ESSCIRC, pp 343-346, September 2004, comprising improved bandwidth, linearity and channel matching.

In document "A 1 GS/s 11b Time-Interleaved ADC in 0.13 μm CMOS," S. Gupta, M. Choi, M. Inerfield, J. Wang, ISSCC Dig. Tech. Papers, pp 264-265, February 2006, a technique to prevent timing errors in a time-interleaved T/H circuit is presented. It uses a front-end sampling switch which is closed only half a period of the master clock. A disadvantage of this method is the decrease in bandwidth. To increase the bandwidth, the switch can be made very large, but then charge injection errors become a problem.

Another technique is the use of the master clock to synchronize the different sampling instants as in document "A Dual-Mode 700-Msample/s 6-bit 200-Msamples/s 7-bit A/D Converter in a 0.25 μm Digital CMOS Process," K. Nagaraj et al., IEEE JSSC, vol. 35, pp 1760-1768, December 2000, which achieves good timing alignment, and does not have the disadvantages of a front-end sample switch.

In applications wherein supply-noise degrades performance, current mode logic (CML) is commonly used due to the fact that the generated supply noise is low. CML uses differential signalling, with signals swings about half the supply voltage. For applications wherein a full swing signal is required, i.e. a sample switch in a T/H circuit, the CML signals have to be converted to full-swing signals. This can be done by an embodiment according to prior art shown in FIG. 13. As can be seen from FIG. 13, eight transistor elements are required within the shown embodiment.

Depending on actual transistor mismatch, the circuit shown in FIG. 13 generates skew, which is different for every instance of the circuit. In the embodiment of the circuit shown in FIG. 13, a lot of transistors contribute to the skew variation. Although scaling of these transistors reduces this variation, the power consumption is increased and the sizes may even become unpractical for high performance applications. The power consumption may become too large or the supply-noise generated by the circuit may become too large.

It is one object of the present application to provide an apparatus, wherein the influence of the skew is significantly reduced. A further object is to avoid an influence of the local supply voltage in the moment of transition. A further object is to reduce power consumption. Another object is to reduce generated supply-noise. Another object is to reduce a delay. A further object is to reduce the jitter added to the present apparatus.

SUMMARY

These and other objects are solved by an apparatus comprising a first transistor element, with at least three terminals, wherein a first terminal is supplied with a first voltage, and wherein a second terminal is supplied with a second voltage. The apparatus comprises a first switching unit, wherein a third terminal is connected to ground potential via the first switching unit. The transistor element comprises a predefined threshold voltage. The first voltage and the second voltage are predefined alternating voltages. The transistor element is configured such that in case a differential voltage between the first predefined alternating voltage and the second predefined alternating voltage is higher than the predefined threshold voltage and the first switching unit is not conductive the third terminal is charged with the first predefined alternating voltage.

The apparatus according to the present application comprises at least a first transistor element. The transistor element comprises three terminals, like drain, source and gate. It may be possible that more than three terminals are provided. The first terminal, like the source terminal is supplied with a first voltage. The second terminal, like the gate can be supplied with a second voltage. It is found according to the application that predefined alternating voltages as first and second voltages are particular suitable for driving the transistor element. Both voltages can be set according to system requirements, in particular depending on a threshold voltage of the transistor element. The second predefined alternating voltage may differ from the first predefined alternating voltage at least in a phase shift. Advantageously, the voltage can comprise a phase shift of approximately 180°. However, other runs of the voltages are also possible as well as the use of two current signals or the like as input signals.

Furthermore, the present apparatus comprises a first switching unit connected between a ground potential and a third terminal of the transistor element, like the drain terminal. Any suitable switch, such as a transistor or the like, can be employed as the first switching unit. Moreover, the switching unit can be controlled by a suitable driving unit. In case the switching unit is conductive, the third terminal is connected to ground potential. The switching unit can be opened without amending the potential applied at the third terminal when the first predefined alternating voltage is smaller than the second predefined alternating voltage. The transistor element may be non-conductive.

What is more, the transistor element can be designed such that the transistor element comprises a particular threshold voltage. For instance, the threshold voltage may depend on system requirements and/or user wishes. In general, a transistor can be operated in a conductive and non-conductive state depending on a threshold voltage. According to the present application, the transistor may become conductive in case the differential voltage between the first and the second predefined alternating voltage, for instance the voltage difference between source and gate, is higher than the threshold voltage. In case, the alternating voltages are periodically voltages, the time point of increasing the threshold voltage can be determined by the phase shift between the first and the second alternating voltages. It shall be understood that the amplitude of the first and second voltages can be also taken into account. Furthermore, it is essential that the switching unit is non-conductive. Otherwise, the potential at the third terminal would be the ground potential. In the case stated above, the third terminal can be charged with the first predefined alternating voltage. The transistor element is conductive. Two different output voltage levels can be achieved. Using this apparatus, the moment of transition and the amending of the voltage applied to the third terminal can be exactly determined. Merely the first and second voltages as well as the threshold voltages has to be adjusted suitable. For instance, the moment of transition can be used to switch between a track-mode and a hold-mode.

The present application may provide for that only the mismatch of merely one transistor influences the skew. The complete "spread budget" can be spent in this transistor. Furthermore, only the difference between the first and second predefined alternating voltages or differential clocks respectively may determine the moment of transition. A common-mode signal can be rejected. Moreover, a local supply voltage cannot influence the moment of transition and compared to implementations, which only use one of the differential clocks and first or second predefined alternating voltage respectively, the effective slope can be doubled, which can imply half the influence of the threshold voltage variations. The delay may be also very low and merely a little jitter may be added by the apparatus according to the present application.

According to an embodiment, the transistor element may be a P-MOS transistor. Such a transistor may be especially suitable due to its small spatial requirements and easy matching possibilities. A mismatch of the transistor can be reduced. Other kinds of transistors can also be employed.

Furthermore, according to another embodiment of the present application, the first switching unit may be configured to be set into the conductive state in case the first predefined alternating voltage is smaller than the second predefined alternating voltage. A suitable driving unit may be arranged within the apparatus. In this case, the third terminal of the first transistor element is connected to ground potential. By setting this third terminal to ground during the time, wherein the transistor element is non-conductive, at least two different voltage levels can be achieved and the moment of transition can be exactly determined due to the exact voltage difference. After closing the first switching unit, the switching unit can be opened without influencing the potential applied at the third terminal. The first predefined alternating voltage can be applied at the third terminal at the moment of transition without any offset or the like.

In a further embodiment of the present application, the apparatus may comprise a second transistor element, wherein a first terminal of the second transistor element may be connectable to the third terminal of the first transistor element. A second terminal of the second transistor element may be connected to ground potential. This second transistor element may be formed as an N-MOS transistor according to another embodiment. It shall be understood that other kinds of transistors can also be used, wherein the particular choice of the second transistor element may depend on the selected first transistor element. Additionally, the apparatus according to the present application may comprise a second transistor element, which may be configured such that a voltage at a third terminal of the second transistor element may depend on the voltage at the third terminal of the first transistor element. In more detail, the third terminal of the second transistor may be the gate terminal of the second transistor. The second transistor can be driven exactly by its gate terminal using the at least two voltage levels generated at the third terminal of the first transistor. In particular, the exact determination of the transmission moment can be used for driving the second transistor element.

In another embodiment of the present application, the apparatus may further comprise at least a third transistor element. A first terminal of the third transistor element may be connectable to the third terminal of the second transistor element. The third transistor element may be formed as an N-MOS transistor according to a further embodiment of the application. The third transistor element may comprise a second terminal supplied by an input signal. Furthermore, a third terminal of the third transistor element may be connectable to ground potential via a capacitor element. The third transistor element may provide for supplying an input signal, like an analogue signal being further processed, to the capacitor element for tracking. The third transistor element can be driven by its gate voltage, in particular by using the voltage generated by the previous transistor elements. The loading of the capacitor element and the switching between two states, like the track state and the hold state, respectively may depend on the first transistor element, in particular on the moment of transition of the first transistor element.

Moreover, the apparatus according to a further embodiment of the present application may comprise at least a second switching unit connectable to the second terminal of the third transistor element and to an operational voltage. When the switching unit is closed, the second terminal of the third transistor element, like the source terminal of the third transistor element, can be supplied with a predefined operational voltage. This allows the possibility of an exact driving of the third transistor element and thus the switching between the at least two states of the transistor element can be easily controlled.

For increasing the linearity of the sample switch, the second switching unit may be formed as a bootstrap circuit. It is found that a bootstrap circuit may be particular suitable, since the linearity of the sample switch can be increased.

The apparatus according to a further embodiment may comprise a transmission gate connectable to the second terminal of the first transistor element. More particularly, the transmission gate can be set in the non-conductive state. In this state, a transmission is not possible and the second predefined alternating voltage is not applied at the second terminal of the first transistor element. In particular, in case a plurality of apparatuses according to the application are arranged in parallel paths, it can be desired that merely some of the apparatus and the first transistor element respectively into a conductive state.

What is more, the apparatus according to another embodiment of the present application may also comprise a pull-up/pull-down switch and/or pull-up/pull-down resistor at the second terminal of the first transistor element. A suitable pull-up/pull-down switch and/or pull-up/pull-down resistor can be arranged between the transmission gate and the second terminal of the first transistor element. When the transmission gate is conductive, the pull-up switch must be inactive for enabling a transmission of the voltage applied at the source terminal to the drain terminal of the first transistor element. An easy controlling of a multiple of T/H path can be provided.

Furthermore, the apparatus according to another embodiment of the application may further comprise an input buffer, which may be connectable to the third terminal of the third transistor element. The input buffer may be a high linearity input buffer. According to another embodiment, the input buffer may be formed as at least two source-followers. By way of example, a P-MOS transistor source-follower connected to an N-MOS transistor source-follower can be employed. It shall be understood that different input buffers can be used.

A further aspect of the present application is an apparatus comprising a first transistor element with at least three terminals, wherein a first terminal is supplied with a first voltage, and wherein a second terminal is supplied with a second voltage, a pull-down resistor, wherein a third terminal is pre-charged to ground potential via the pull-down resistor, wherein the pull-down resistor comprises a predefined conductance and the transistor element comprises a predefined conductance, wherein the first transistor element comprises a predefined threshold voltage, wherein the first voltage and the second voltage are predefined alternating voltages, and wherein the first transistor element is configured such that in case a differential voltage between the first predefined alternating voltage and the second predefined alternating voltage is higher than the predefined threshold voltage and the conductance of the pull-down resistor is lower than the conductance of the transistor element the third terminal is charged with the first predefined alternating voltage.

Another aspect of the present application is an apparatus, comprising a first transistor element with at least three terminals, wherein a first terminal is supplied with a first voltage, and wherein a second terminal is supplied with a second voltage, a first switching unit, wherein a third terminal is connected to a predefined positive potential via the first switching unit, wherein the first transistor element comprises a predefined threshold voltage, wherein the first voltage and the second voltage are predefined alternating voltages, and wherein the first transistor element is configured such that in case a differential voltage between the first predefined alternating voltage and the second predefined alternating voltage is higher than the predefined threshold voltage and the first switching unit is not conductive the third terminal is charged with the first predefined alternating voltage.

It shall be understood that the transistor element may be an N-MOS transistor, while the further transistor elements may be P-MOS transistors.

Another aspect of the present application is an apparatus, comprising a first transistor element with at least three terminals, wherein a first terminal is supplied with a first voltage, and wherein a second terminal is supplied with a second voltage, a pull-down resistor, wherein the pull-down resistor comprises a predefined conductance and the transistor element comprises a predefined conductance, wherein a third terminal is pre-charged to a positive potential via the pull-down resistor, wherein the first transistor element comprises a predefined threshold voltage, wherein the first voltage and the second voltage are predefined alternating voltages, and wherein the first transistor element is configured such that in case a differential voltage between the first predefined alternating voltage and the second predefined alternating voltage is higher than the predefined threshold voltage and the conductance of the pull-down resistor is lower than the conductance of the transistor element the third terminal is discharged to the first predefined alternating voltage.

Another aspect of the present application is a method comprising supplying a first predefined alternating voltage to a first terminal of a first transistor element and supplying a second predefined alternating voltage to a second terminal of the first transistor element. The method comprises connecting a switching unit to a third terminal of the first transistor element and to ground potential. The method includes opening the switching unit in case the first predefined alternating voltage is higher than the second predefined alternating voltage. The method encompasses setting a predefined threshold voltage of the first transistor element. The method comprises charging the third terminal of the first transistor element with the first predefined alternating voltage in case the differential voltage between the first predefined alternating voltage and the second predefined alternating voltage is higher than the predefined threshold voltage. The method is provided for CML to SE conversion with low skew (delay) variation. A moment of transition can be exactly determined by setting both alternating voltages and the threshold voltage of the first transistor element accordingly.

According to a further embodiment of the present application, at least two different operational modes depending on the voltage at the third terminal of the first transistor element can be provided. In particular, a hold mode and a track mode can be provided. For instance, in case the third terminal of the first transistor element is connected to ground potential, the track mode is performed, meanwhile the hold mode can be performed in case the first predefined alternating voltage is applied to the third terminal of the first transistor element. Merely one time-critical moment can be achieved.

A further aspect of the present application is computer readable medium having a computer program stored thereon, the computer program comprising instructions operable to cause a processor to perform a method stated above.

Another aspect of the present application is track and hold circuit comprising an apparatus stated above. A Time-Interleaved track and hold circuit in 0.13 μm CMOS sub-sampling a 4 GHz Signal with 43 dB SNDR may be provided.

These and other aspects of the present patent application become apparent from and will be elucidated with reference to the following figures. The features of the present application and of its exemplary embodiments as presented above are understood to be disclosed also in all possible combinations with each other.

BRIEF DESCRIPTION OF THE DRAWINGS

In the figures show.

Like reference numerals in different figures indicate like elements.

DETAILED DESCRIPTION OF THE DRAWINGS

In the following detailed description of the present application, exemplary embodiments of the present application will describe and point out an apparatus for performing the conversion from a low-amplitude differential input clock signal (CML) to a full swing single-ended (SE) output signal comprising reduced influences of the skew, reduced delay as well as reduced power consumption.

Figure 1:
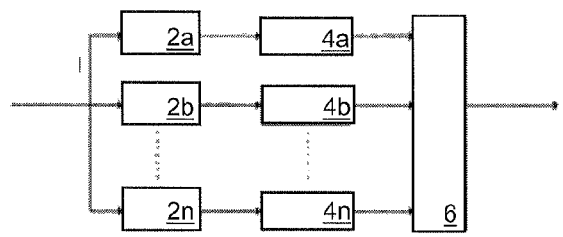
FIG. 1 an embodiment of a time-interleaved analogue digital converter architecture, FIG. 2 an overview of one of a plurality of track and hold channels, FIG. 3 a first embodiment of the apparatus according to the present application, FIG. 4 a first diagram of the waveforms of the first and second predefined alternating voltage according to the first embodiment of the apparatus according to the present application, FIG. 5 a second embodiment of the apparatus according to the present application, FIG. 6 a second diagram of the waveforms of the first and second predefined alternating voltage according to the second embodiment of an apparatus according to the present application, FIG. 7 a third embodiment of the apparatus according to the present application comprising a bootstrap circuit, FIG. 8 a third diagram of the waveforms of the first and second predefined alternating voltage according to the a third embodiment of an apparatus according to the present application comprising a bootstrap circuit, FIG. 9 a fourth embodiment of the apparatus according to the present application enabling the use of a multi-phase clock, FIG. 10 a further exemplified diagram of a measurement result of a single channel, FIG. 11 a further exemplified diagram of a measurement result of a time-interleaved analogue digital converter, FIG. 12 a further exemplified diagram of an extracted normalized timing offset, FIG. 13 an embodiment according to prior art, FIG. 14 a fifth embodiment of the apparatus according to the present application.

FIG. 1 shows an embodiment of a time-interleaved analogue digital converter architecture. The shown circuit is supplied with an analogue signal. More particularly, time-interleaved track and hold circuits (T/H) 2a to 2n are described for use in a time-interleaved analogue digital converter as shown in FIG. 1. An analogue input signal is fed to a multiple of track and hold circuits 2a to 2n. The T/H circuits 2a to 2n are arranged in parallel paths. Moreover, each of these T/H circuits 2a to 2n is connected to an analogue digital converter 4a to 4n. The output signals are forwarded to at least one digital multiplexer 6, which comprises a digital output signal.

Figure 2:
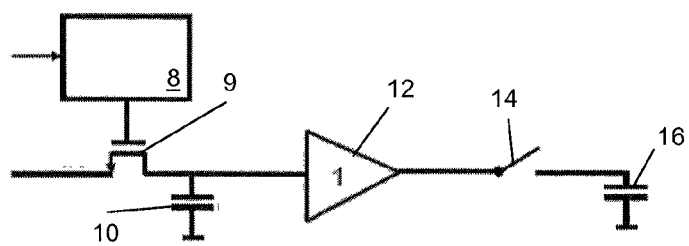

What is more, FIG. 2 shows an overview of one of a plurality of track and hold channels, and more particularly, a basic schematic of one channel is shown in FIG. 2. The time-interleaved T/H may comprise 16 channels, which may be based on the analysis that a sample-rate of about 100 MS/s is viable for sub-ADCs with a good power-efficiency and about 50 dB SNDR. The depicted circuit may be (pseudo) differential, and only a single-ended version is shown in FIG. 2.

Time-interleaving may relax the requirements on the ADC. Just by adding the switch 14, the advantages may also hold for the T/H circuit buffers 12. An additional advantage is the reduced input capacitance of the buffer 12.

Before the timing matching is explained in detail, channel matching is elucidated. In a time-interleaved ADC, differences between channels should be sufficiently small: offsets between channels may cause tones at multiples of $f_S/16$, (ifac=16) while differences in gain and timing result in tones at multiples of $f_S/16 \pm f_{IN}$.

Reducing channel offsets by straightforward device sizing to reach the required accuracy conflicts with speed and power constraints is known. Channel offsets may be made adjustable in this design. Channel gain may be adjustable as well to correct for errors stemming from mismatch in the input buffer and the sample process. Both calibrations can be controlled digitally by modifying analogue bias settings in the input buffer via an 6/7 bits DAC. In this test-chip the digital bias settings may be controlled manually. In an actual implementation, channel gain and offset can relatively easily be adjusted by a start-up calibration requiring only DC test-signals.

Calibration of timing mismatch however, requires high-frequency test-signals and complicated calibration algorithms. By careful design it is tried to minimize timing mismatch, avoiding the need for this calibration.

A technique to prevent timing errors in a time-interleaved T/H circuit may use a front-end sampling switch, which is closed only half the period of the master clock. A disadvantage of this method is the decrease in bandwidth. Another technique is the use of the master clock to synchronize the different sampling instants, which achieves good timing alignment and it does not have the disadvantages of a front-end sample switch. To minimize timing offsets the following techniques are used: One master clock, such that the actual sample moment only depends on one common clock. Matched lines configured to distribute clock and input signals to the channels. Minimized skew-mismatch of the conversion between the common master-clock and the sample-switch using a new circuit-technique can be achieved.

In applications wherein supply-noise may degrade performance, current mode logic (CML) is commonly used because it generates little supply noise. CML uses differential signalling, with signal swings of about half the supply voltage in the present design. To convert the CML master clock into a full-swing signal suitable for the sample-switch, a conversion circuit is needed. With a conventional solution on a previous chip a timing misalignment of 6 ps RMS is measured, which is too high for the target specification.

More particularly, time-interleaved T/H circuits and I/Q matching in mixers and transceivers rely on high-quality clocks with good matching of a timing delay difference (a low timing skew) to a multitude of switches. In many cases not the skew itself, but the variation in the skew towards different parts of the circuit degrades performance. In these applications where supply-noise may degrade performance, current mode logic (CML) is commonly used because it generates little supply noise. To amplify the CML master clock into a single-ended (SE) full-swing rail-to-rail signal, suitable to drive the full-CMOS sample-switch, a conversion circuit is needed. To minimize skew variation the present apparatus comprises a CML-to-SE circuit to minimize the number of devices in the path from the CML master-clock to the CMOS sample switches, and avoids power supply induced jitter on the clock edge timing.

Figure 3:
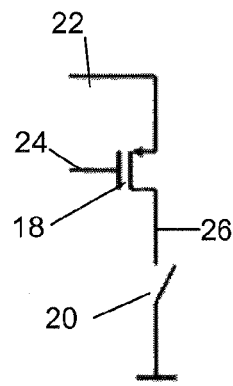

FIG. 3 shows a first embodiment of the apparatus according to the present application. The shown embodiment comprises a first transistor element 18, like a P-MOS transistor 18, comprising at least three terminals 22 to 26. The first terminal 22, like the source terminal can be supplied by a first predefined alternating voltage $V_{CP}$. The second terminal 24, like the gate terminal, is supplied by a second predefined alternating voltage $V_{CN}$. The third terminal 26, such as the drain terminal comprises a voltage $V_{OUT}$ and is connected to a switching unit 20. The switching unit 20 can be realized by any suitable switch. Moreover, the switching unit 20 is connected to ground potential. The transistor element 18 may comprise a threshold voltage $V_T$, wherein this voltage $V_T$ can be also predefined. In particular, a suitable choice of the first and second alternating voltage $V_{CP}$, $V_{CN}$ in combination with the threshold voltage $V_T$ may achieve an accurate moment of transition.

It shall be understood that, according to other variants of the present application, a pull-down resistor can be used instead of a switching unit as well as the switching unit can be connected to a predefined positive potential for the case the circuit is put upside down. For example, N-MOS transistors can be used instead of P-MOS transistors and vice versa. This may also apply for the embodiments stated below.

Figure 4:
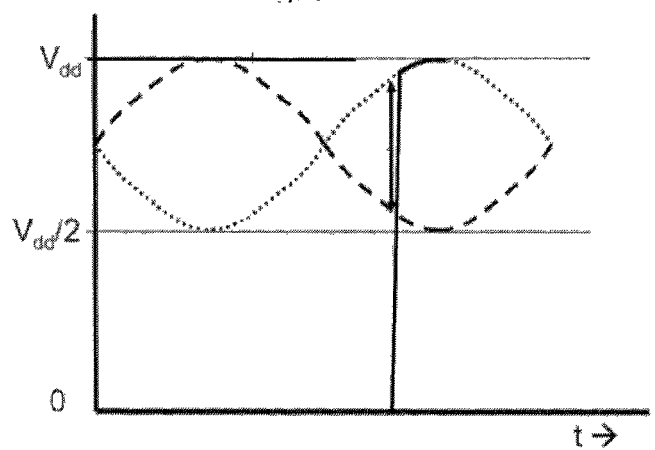

In the following, the operation of the present apparatus shown in FIG. 3 is elucidated by the aid of FIG. 4, and the choice of the three voltages $V_{CP}$, $V_{CN}$ and $V_T$ is explained as well. FIG. 4 shows a diagram of the waveforms of the first and second predefined alternating voltages $V_{CP}$, $V_{CN}$ (CP, CN) of a first embodiment of the apparatus according to the present application. As can be seen from the diagram, the predefined alternating voltages $V_{CP}$(dotted lien), $V_{CN}$(dashed line) comprise a sine wave run. Furthermore, their maximum amplitudes are equal as well as their minimum amplitudes. The threshold voltage is indicated by the arrow and the solid line denotes the output voltage $V_{OUT}$ applied at the third terminal 26.

The operation of the apparatus according to the present application is as follows: It is assumed that the first switching unit 20 is closed and $V_{CP} < V_{CN}$. In this case the output voltage $V_{OUT}$ and the third terminal 26 respectively are at ground potential and the P-MOS transistor 18 is not conducting. In this situation switching unit 20 can be opened, without influencing the potential $V_{OUT}$ applied at the third terminal 26 of the transistor element 18. Then the first alternating voltage $V_{CP}$ may be come higher than the second alternating voltage $V_{CN}$ ($V_{CP} > V_{CN}$). When the differential voltage between $V_{CP}$ and $V_{CN}$ becomes larger than the threshold voltage $V_T$ of the P-MOS transistor 18, the transistor element 18 will start conducting and the third terminal 26 will be charged with the first alternating voltage $V_{OUT} = V_{CP}$. The threshold voltage $V_T$ as well as the first and second alternating voltages $V_{CP}$ and $V_{CN}$ may be set according to system requirements and may depend on the value of the operational voltage $V_{dd}$. The described voltage transition can be used to determine the time critical sampling event of i.e. a T/H circuit. To return to the initial situation, switching unit 20 has to be closed when $V_{CP} < V_{CN}$. The third terminal 26 of the first transistor element 18 is connected to ground potential again and the process can start anew.

Figure 5:
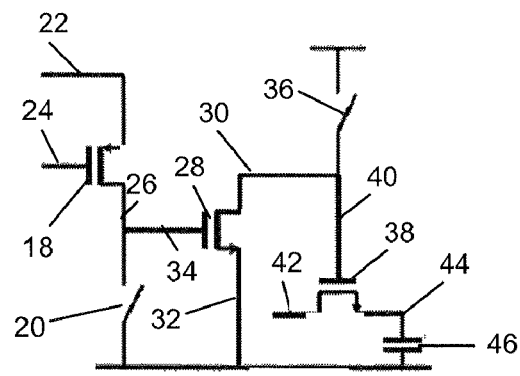

A second embodiment of the apparatus according to the present application is shown in FIG. 5. To use the apparatus shown in FIG. 3 in a T/H application, the circuit can be extended as shown in FIG. 5 for CML to SE conversion. The output signal $V_{OUT}$ of the first transistor element 18 can be forwarded to a first terminal 34 of a second transistor element 28, like the gate terminal of an N-MOS transistor. The further terminals 30 and 32, such as the source and drain terminals, of the second transistor element 28 can be connected on the one hand to ground potential and on the other hand to a second switching unit 36 and a first terminal 40 of a third transistor element 38. This first terminal 40 of the third transistor element 38 may be the gate terminal of an N-MOS transistor. Furthermore, the third transistor element 38 can be supplied with an input signal $V_{IN}$ via its second terminal 42. In addition, the third transistor may comprise a capacitor element 46 at its third terminal 44. The capacitor element 46 may be provided for acting as a storing element. The second switching unit 36 is supplied by a voltage $V_{dd}$.

This present apparatus can be used to minimize skew variation and jitter. Furthermore, the path from the common master-clock to the different sample switches can be made as short as possible.

Figure 6:
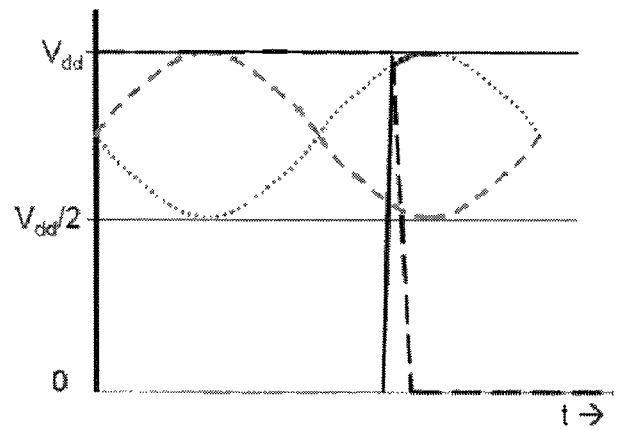

The operation of the apparatus shown in FIG. 5 is as follows. It can be assumed that switching units 20 and 36 are closed and $V_{CP} < V_{CN}$. The voltage runs are similar to the previous embodiment. Additionally, FIG. 6 shows a second diagram of the waveforms of the first and second predefined alternating voltages $V_{CP}$, $V_{CN}$ according to the second embodiment of the apparatus according to the present application. The shown voltage curves are similar to the curves shown in FIG. 4. Furthermore, the voltage $V_S$ applied at the gate terminal 40 of the third transistor element 38 is depicted as a dashed line starting at the operational voltage $V_{dd}$. The third terminal 26 of the first transistor 18 and node $V_{OUT}$ respectively is at ground potential. As stated above, the P-MOS transistor 18 is not conducting. The third transistor element 38, like the N-MOS transistor 38, is in the conduction stage due to the operational voltage $V_{dd}$ applied at its gate terminal 40. In other words the present apparatus is in track-mode. The input signal $V_{in}$ can be fed to the capacitor element 46. In this situation switching unit 20 and 36 can be opened, without influencing the potential of $V_{OUT}$ and $V_S$, wherein voltage $V_S$ is the voltage applied at the gate terminal 40 of the third transistor element 38. Then, the first alternating voltage $V_{CP}$ may increase the second alternating voltage $V_{CN}$ ($V_{CP} > V_{CN}$). When the differential voltage between $V_{CP}$ and $V_{CN}$ becomes larger than the threshold voltage $V_T$ of the P-MOS transistor 18, the first transistor element 18 will start conducting and its third terminal 26 is charged to $V_{OUT} = V_{CP}$ as in the previous case. In this case, the second transistor element 28 may start conducting, which brings node $V_S$ and the gate terminal 40 of the third transistor element 38 respectively to ground. In this case, the third transistor element 38 is set into the non-conductive state. The input signal $V_{in}$ cannot be forwarded to the capacitor element 46. The present apparatus is now in the hold-mode. This is the only time-critical event. To return to track-mode switching units 20 and 36 have to be closed when $V_{CP} < V_{CN}$.

By cascading the first and second transistor elements 18 and 28, which are for the rest floating (no current source), the gain can be maximized. This may result in a very steep slope at Vs and may make the sample process more ideal. Due to the gain of the first transistor element 18, the influence of the threshold-spread of the second transistor element 28 can be mitigated. Before going into hold-mode, the gate terminal 40 of the third transistor element can be floating and the apparatus can be extended with a bootstrapping circuit 48 to increase the linearity of the sample switch. This is elucidated according to the following third embodiment of the apparatus according to the present application.

Figure 7:
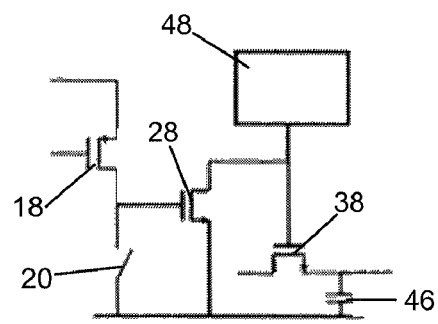

According to the third embodiment of the apparatus according to the present application shown in FIG. 7, the second switching unit 36 can be substituted by a bootstrap circuit 48. For saving the clarity of FIG. 7, not all components are denoted with reference signs. An example comprising a bootstrap circuit 48 is shown in FIG. 7.

Figure 8:
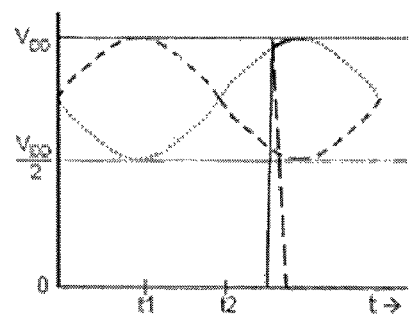

The operation of the apparatus shown in FIG. 7 is as follows. The shown T/H circuit can be put in track-mode by the bootstrap circuit 48, which makes the voltage $V_{GS}$ of the third transistor element 38 equal to about $V_{dd}$. At the end of the track-mode (t=t2), the gate terminal 40 can be left floating by the bootstrap circuit 48 and for further bootstrapping it is relied on parasitic capacitances. Now, to switch into hold-mode, the gate terminal 40 of the third transistor element 38 has to be discharged to ground rapidly. The first and second transistor elements 18 and 28 may take care of this. It can be assumed that the first switching unit 20 is closed and $V_{CP} < V_{CN}$, so the third terminal 26 of the first transistor element 18 is at ground potential and the first transistor element 18 is non-conducting. In this state the first switching unit 20 can be opened, without influencing the potential of the third terminal 26. When the differential voltage of the differential master clock ($V_{CP} - V_{CN}$) becomes larger than the threshold voltage $V_T$ of the first transistor element 18, this transistor element 18 will start conducting and its third terminal will be charged to $V_{OUT} = V_{CP}$ as shown in FIG. 7. This will make the second transistor element 28 conducting, discharging the gate terminal 40 of the third transistor element 38 rapidly and putting the present apparatus into hold-mode. This is the only time-critical operation in the T/H circuit. The corresponding waveforms of signals $C_N$, $C_P$ of the third embodiment of the apparatus according to the present application comprising a bootstrap circuit 48 are depicted in the third diagram of FIG. 8, wherein the shown curves are similar to the curves shown in FIG. 6.

Figure 9:
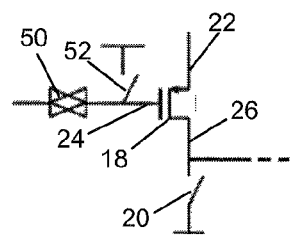

FIG. 9 shows a further embodiment of the apparatus according to the present application. As can be seen from FIG. 9, a transmission-gate 50 (TM-gate) and a pull-up switch 52 can be added. In a time-interleaved T/H circuit, the different channels should sample one after the other, with a delay of one clock-period. At the rising edge of the clock, only one of the channels should switch into hold-mode. When the T/H circuit should not switch into hold-mode, the TM-gate 50 can be made non-conducting and the gate-node 24 of the first transistor element 18 is pulled to the operational voltage $V_{dd}$. In this case the first transistor element 18 may never start conducting and its third terminal 26 may stay at ground. When the present apparatus should switch into hold-mode, the TM-gate 50 can be made conducting when $V_{CP} < V_{CN}$ (e.g. t=t1) and the pull-up switch 52 can be made inactive. In this case the behaviour of the apparatus is the same as without the TM-gate 50 and the T/H circuit switches into hold-mode when $V_{CP} - V_{CN} > V_T$.

Applications of the current-mode-logic to single-ended conversion circuit can be the following. In applications like time-interleaved T/H circuits, the different T/H circuits should sample one after the other. So, different circuit instances of the T/H circuit should sample at different phases of the clock.

The present application provides an apparatus wherein only the mismatch of the first and second transistor elements 18 and 28 may influence the skew. The complete "spread budget" can be spent in these transistor elements 18 and 28. Additionally, only the difference between the differential clocks and voltages respectively CP and CN may determine the sample moment. The common-mode signal can be rejected. Moreover, both differential clocks CP and CN can be used and the effective slope can be doubled, which halves the influence of the threshold voltage variations of the second transistor element 28. By keeping the path from input clock to sample switch short, little jitter can be generated in the apparatus according to the present application. By cascading the first and second transistor elements 18 and 20, which are otherwise not connected (no current sources), the gain can be maximized. This may result in a very steep slope at $V_S$ and may make the sample process more ideal.

The expected timing-misalignment of an exemplified embodiment may be 0.45 ps RMS. This value can be derived from multiplying the (simulated) switching-slopes by the $\sigma(\Delta V_T)$ of the respective transistor elements 18, 28 and 38.

Figure 10:
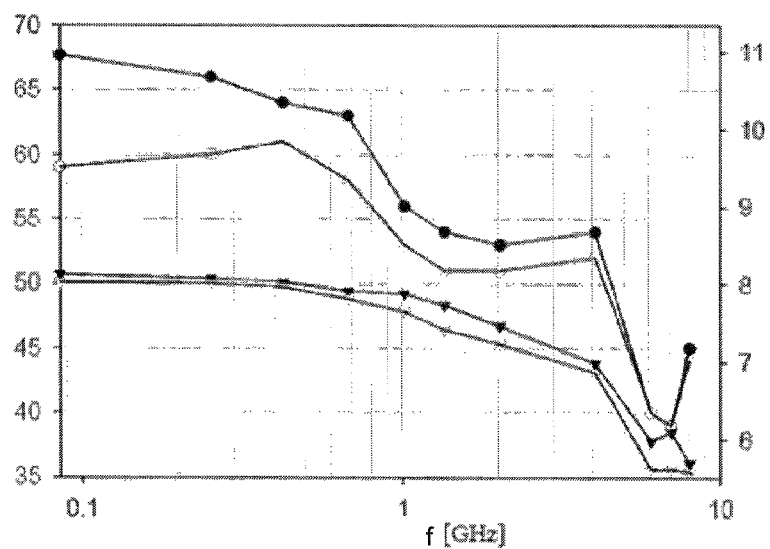
Figure 11:
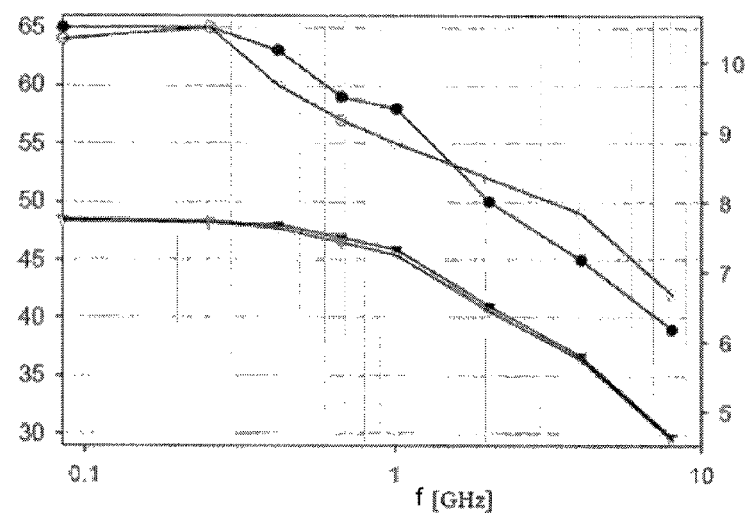

In the following three FIGS. 14 to 16, exemplified measurement results are depicted to point out the advantages of the present application. In FIGS. 10 and 11, the lines comprising filled circles represent the SFDR (spurious free dynamic range), the lines comprising the not filled circles represent the—THD (total harmonic distortion), the lines comprising filled triangles represent the SNR (signal to noise ratio) and the lines comprising the not filled triangles represent the SNDR (signal to noise and distortion ratio). These parameters are depicted in dB. It shall be understood that the measurement results corresponds to merely one embodiment of a plurality of possible embodiments of the apparatus according to the application. First, the measurement result of a single channel is discussed. During this measurement all channels may be active, however only the data from one channel is analyzed. The T/H circuit may be directly connected to a 50Ω signal generator. In FIG. 10 the measurement result is shown at a total sample-rate of 1350 MS/s and thus 1350/16≈84.4 MS/s for a single channel. At low input frequencies the SNDR is 50 dB, simulations indicate that this is limited by ADC noise. The THD for low frequencies is −60 dB. For higher input frequencies than the Nyquist frequency per channel (>42 MHz), the ADCs are sub-sampling and performance degradation is purely due to the T/H circuit. The THD improvement at 8 GHz is due to a decrease in signal amplitude caused by losses in the test-bench signal path. THD at 4 GHz is −52 dB and THD at 8 GHz is −44 dB, which shows the excellent bandwidth and linearity of the T/H circuit due to the use of the new circuit techniques applied in the T/H circuit and the buffer. At 4 GHz input frequency the SNDR is 43 dB and at 8 GHZ the SNDR is 36 dB.

A worst-case approximation of the RMS jitter is given by: $\sigma(\Delta t) = 10^{-SNR/20} / 2\pi f_{IN}$. Using this, the total jitter stemming from clock and signal generators and the circuit is only 0.2 ps RMS, which is better than any value for a T/H or ADC in CMOS found in literature. At high signal frequencies only jitter limits the SNDR.

The 16-channel interleaved performance at 1350 MS/s is shown in FIG. 11. The SNDR is 48 dB at low input frequencies and the ERBW is 1 GHz. Compared to the single channel case, the performance is only slightly degraded, showing that channel gain and offset are adjusted satisfactory and the step-size of the adjustment DACs is sufficiently small.

Figure 12:
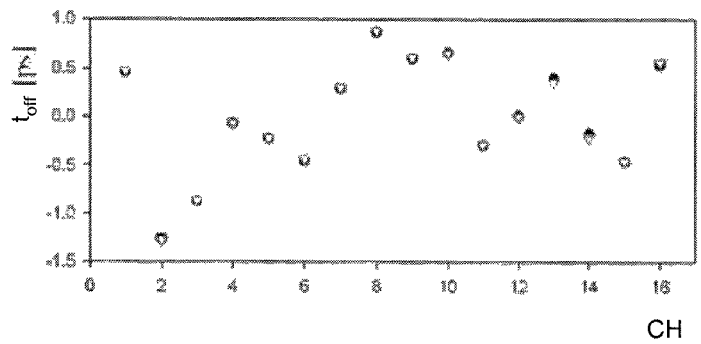
Figure 13:
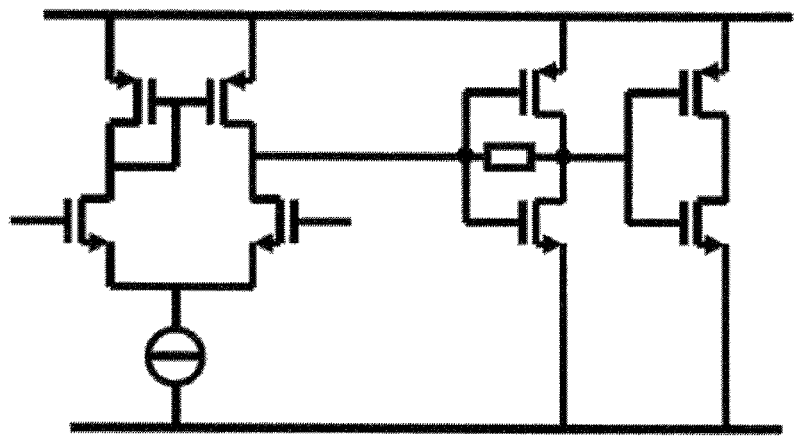

It is possible to extract the timing-misalignment from the measured data by determining the phase of the input signal for each channel by means of an FFT. This way jitter is averaged out and only the timing offsets remain. The result of this operation for two measurements is shown in FIG. 12. The circles my represent a first measurement and the triangles a second measurement. The extracted RMS timing misalignment is 0.6 ps RMS, which is close to the expected value of 0.45 ps RMS and which shows the low skew-variation technique is useful. Due to the dominance of timing-misalignment, total timing error across all channels including jitter is also 0.6 ps RMS. For ADCs with a large bandwidth (>1 GHz), this value is slightly better than the best found in literature "A 20 GS/s 8b ADC with a 1 MB memory in 0.18 μm CMOS," K. Poulton et al., ISSCC Dig. Tech. Papers, pp 318-319, February 2003 where elaborate timing calibration is used. At 2 GHz the SNDR is 41 dB and at 4 GHz the SNDR is 37 dB, limited by timing-misalignment.

The present application describes an electronic circuit with minimal variation in throughput time of (edges of) a (clock) signal. This is particularly relevant when an electronic function is based on multiple independent instances of this electronic circuit, and the quality of this electronic function is limited by the difference in throughput time between those instances.

The function of the circuit is to perform the conversion from a low-amplitude differential input (clock) signal (Current-Mode-Logic, i.e. CML) to a full swing (from ground rail to supply rail) single-ended (SE) output signal. Distribution by means a low-amplitude differential clock signal creates fewer disturbances to surrounding circuitry and also makes such a signal less sensitive to variation in supply voltage.

In addition, the apparatus of the present application comprises a small number of components between differential input and single-ended output such that only a few components need to be optimized for equality. This may result in a small throughput time, and thus, reduced susceptibility for variation of this throughput time. Moreover, the present apparatus may exploit the full difference (and only the difference) between positive and the negative branch of its differential input signal. Thereby exploiting the maximum available signal in comparison to any (differential) disturbance and becoming insensitive to any variation common to both positive and negative input branch. In addition, the apparatus may comprise a throughput time independent of the local supply voltage level.

Figure 14:
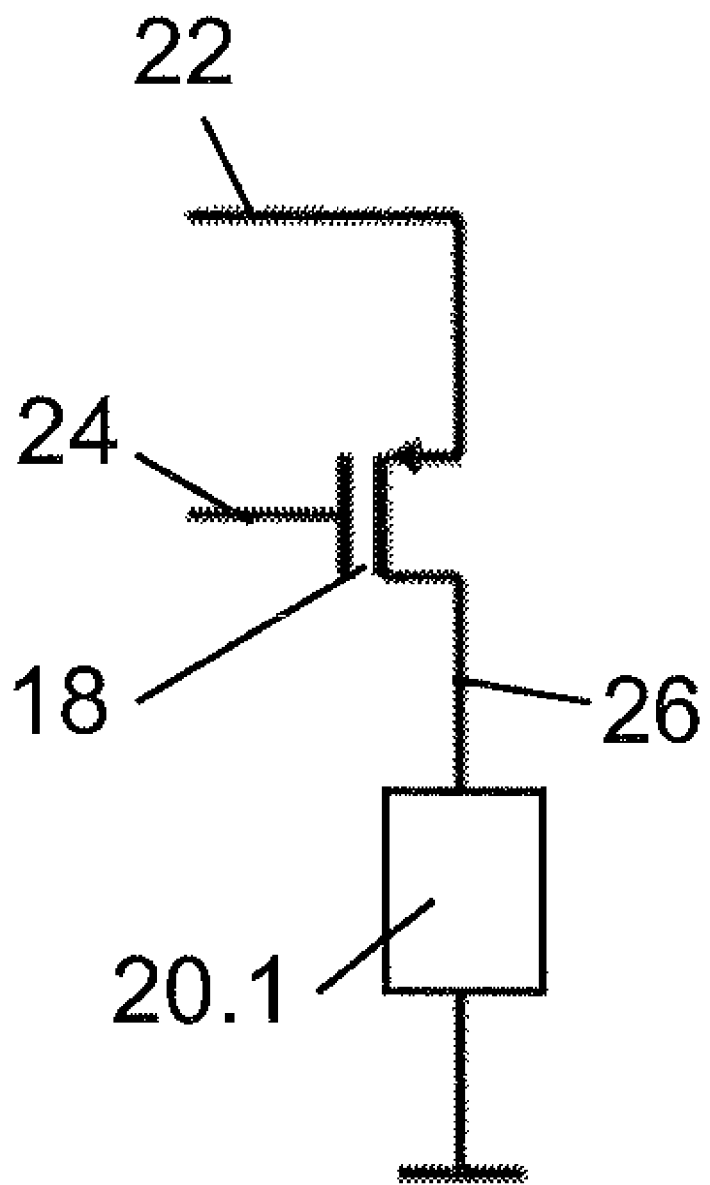

A fifth embodiment of the present apparatus is shown in FIG. 14. The shown embodiment differs from the embodiment according to FIG. 5 in that a pull-down resistor 20.1 is used instead of a switching unit.

Furthermore, it is readily clear for a person skilled in the art that the logical blocks in the schematic block diagrams as well as the flowchart and algorithm steps presented in the above description may at least partially be implemented in electronic hardware and/or computer software, wherein it depends on the functionality of the logical block, flowchart step and algorithm step and on design constraints imposed on the respective devices to which degree a logical block, a flowchart step or algorithm step is implemented in hardware or software. The presented logical blocks, flowchart steps and algorithm steps may for instance be implemented in one or more digital signal processors, application specific integrated circuits, field programmable gate arrays or other programmable devices. The computer software may be stored in a variety of storage media of electric, magnetic, electro-magnetic or optic type and may be read and executed by a processor, such as for instance a microprocessor. To this end, the processor and the storage medium may be coupled to interchange information, or the storage medium may be included in the processor.

The invention claimed is:

1. An apparatus, comprising:
a first transistor element with at least three terminals, wherein a first terminal is supplied with a first voltage, and a second terminal is supplied with a second voltage;
a first switching unit, wherein a third terminal of the first transistor element is connected to a ground potential via the first switching unit; and
a second transistor element, formed as an N-MOS transistor, wherein a first terminal of the second transistor element is connectable to the third terminal of the first transistor element, and a second terminal of the second transistor element is connected to the ground potential, wherein the first transistor element has a predefined threshold voltage, the first voltage and the second voltage are predefined alternating voltages, and the first transistor element is configured such that in case a differential voltage between the first predefined alternating voltage and the second predefined alternating voltage is higher than the predefined threshold voltage and the first switching unit is not conductive, the third terminal is charged with the first predefined alternating voltage.

2. The apparatus according to claim 1, wherein the first transistor element is formed as a P-MOS transistor.

3. The apparatus according to claim 1, wherein the first switching unit is configured to be set into a conductive state when the first predefined alternating voltage is smaller than the second predefined alternating voltage.

4. The apparatus according to claim 1, wherein the second transistor element is configured such that a voltage at a third terminal of the second transistor element depends on the voltage at the third terminal of the first transistor element.

5. The apparatus according to claim 1, further comprising:
a third transistor element, wherein a first terminal of the third transistor element is connectable to the third terminal of the second transistor element.

6. The apparatus according to claim 5, wherein the third transistor element is formed as an N-MOS transistor.

7. The apparatus according to claim 5, wherein the third transistor element comprises:
a second terminal supplied by an input signal; and
a third terminal connectable to a ground potential via a capacitor element.

8. The apparatus according to claim 7, further comprising:
a second switching unit connectable to the second terminal of the third transistor element and to an operational voltage.

9. The apparatus according to claim 8, wherein the second switching unit is formed as a bootstrap circuit.

10. The apparatus according to claim 1, further comprising:
a transmission gate connectable to the second terminal of the first transistor element.

11. The apparatus according to claim 10, wherein the second terminal of the first transistor element comprises either a pull-up/pull-down switch or a pull-up/pull-down resistor.

12. The apparatus according to claim 7, further comprising:
an input buffer connectable to a third terminal of the third transistor element.

13. The apparatus according to claim 12, wherein the input buffer is formed as at least two source-followers.

14. An apparatus, comprising:
a first transistor element with at least three terminals, wherein a first terminal is supplied with a first voltage, and a second terminal is supplied with a second voltage;
a pull-down resistor, wherein the pull-down resistor has a predefined conductance and the first transistor element has a predefined conductance and a third terminal of the first transistor element is pre-charged to ground potential via the pull-down resistor; and
a second transistor element, formed as an N-MOS transistor, having a terminal connectable to a ground potential via a capacitor element, wherein the first transistor element has a predefined threshold voltage, the first voltage and the second voltage are predefined alternating voltages, and the first transistor element is configured such that in case a differential voltage between the first predefined alternating voltage and the second predefined alternating voltage is higher than the predefined threshold voltage and the conductance of the pull-down resistor is lower than the conductance of the transistor element,. the third terminal is charged with the first predefined alternating voltage.

15. An apparatus, comprising:
a first transistor element with at least three terminals, wherein a first terminal is supplied with a first voltage, and a second terminal is supplied with a second voltage;
a first switching unit, wherein a third terminal of the first transistor element is connected to a predefined positive potential via the first switching unit; and
a bootstrap circuit that acts as a second switching unit, wherein the first transistor element has a predefined threshold voltage, the first voltage and the second voltage are predefined alternating voltages, and the first transistor element is configured such that in case a differential voltage between the first predefined alternating voltage and the second predefined alternating voltage is higher than the predefined threshold voltage and the first switching unit is not conductive the third terminal is discharged to the first predefined alternating voltage.

16. An apparatus, comprising:
a first transistor element with at least three terminals, wherein a first terminal is supplied with a first voltage, and a second terminal is supplied with a second voltage;

a pull-down resistor, wherein the pull-down resistor has a predefined conductance and the first transistor element has a predefined conductance and a third terminal of the first transistor element is pre-charged to a positive potential via the pull-down resistor; and a transmission gate connectable to the second terminal of the first transistor element, wherein the first transistor element has a predefined threshold voltage, the first voltage and the second voltage are predefined alternating voltages, and the first transistor element is configured such that in case a differential voltage between the first predefined alternating voltage and the second predefined alternating voltage is higher than the predefined threshold voltage and the conductance of the pull-down resistor is lower than the conductance of the transistor element, the third terminal is discharged to the first predefined alternating voltage.

17. A method, comprising:

supplying a first predefined alternating voltage to a first terminal of a first transistor element;

supplying a second predefined alternating voltage to a second terminal of the first transistor element;

connecting a switching unit to a third terminal of the first transistor element and to a ground potential;

opening the switching unit in case the first predefined alternating voltage is higher than the second predefined alternating voltage;

setting a predefined threshold voltage of the first transistor element;

charging a third terminal of the first transistor element with the first predefined alternating voltage in case the differential voltage between the first predefined alternating voltage and the second predefined alternating voltage is higher than the predefined threshold voltage; and coupling the charged third terminal of the first transistor element to a first terminal of a second transistor element formed as an N-MOS transistor, wherein a second terminal of the second transistor element is connected to the ground potential.

18. The method according to claim 17, further comprising:

at least two different operational modes depending on the voltage at the third terminal of the first transistor element.

19. A computer readable medium having a computer program stored thereon, the computer program comprising: instructions operable to cause a processor to perform the method according to claim 17.

20. A track and hold circuit comprising the apparatus according to claim 1.

* * * * *